(12) United States Patent
Chen et al.

(10) Patent No.: US 9,370,120 B2
(45) Date of Patent: Jun. 14, 2016

(54) SLIDE ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 32 days.

(21) Appl. No.: 14/157,668

(22) Filed: Jan. 17, 2014

(65) Prior Publication Data

US 2015/0201754 A1    Jul. 23, 2015

(51) Int. Cl.
| | |
|---|---|
| A47B 96/06 | (2006.01) |
| H05K 7/14 | (2006.01) |
| A47B 96/14 | (2006.01) |
| A47B 96/02 | (2006.01) |
| A47B 47/00 | (2006.01) |
| H05K 7/18 | (2006.01) |
| A47B 96/07 | (2006.01) |
| A47B 88/04 | (2006.01) |
| A47B 46/00 | (2006.01) |

(52) U.S. Cl.
CPC .......... *H05K 7/1489* (2013.01); *A47B 47/0016* (2013.01); *A47B 47/0058* (2013.01); *A47B 88/0418* (2013.01); *A47B 96/025* (2013.01); *A47B 96/067* (2013.01); *A47B 96/068* (2013.01); *A47B 96/07* (2013.01); *A47B 96/145* (2013.01); *A47B 96/1458* (2013.01); *H05K 7/183* (2013.01); *A47B 46/00* (2013.01); *A47B 88/044* (2013.01); *A47B 96/1408* (2013.01); *A47B 96/1441* (2013.01); *A47B 2088/0444* (2013.01)

(58) Field of Classification Search
CPC ..... A47B 96/06; A47B 96/067; H05K 7/1489
See application file for complete search history.

(56) References Cited

U.S. PATENT DOCUMENTS

| | | | |
|---|---|---|---|
| 6,609,619 B2 | 8/2003 | Abbott | |
| 6,681,942 B2 * | 1/2004 | Haney | A47B 88/044 211/183 |
| 7,055,701 B2 | 6/2006 | Dean et al. | |
| 7,218,526 B2 | 5/2007 | Mayer | |
| 7,357,362 B2 * | 4/2008 | Yang | A47B 88/044 248/220.22 |

(Continued)

FOREIGN PATENT DOCUMENTS

EP    2764796 A1 *   8/2014   ........... A47B 88/044

*Primary Examiner* — Jonathan Liu
*Assistant Examiner* — Chiedu Chibogu
(74) *Attorney, Agent, or Firm* — Rosenberg, Klein & Lee

(57) ABSTRACT

A slide assembly used for installing a chassis to a rack includes an engaging member which includes a body portion, a first fastening portion and a second fastening portion. The first and second fastening portions are perpendicularly connected to an end of the body portion. The second fastening portion bends and extends from an end of the first fastening portion. An engaging space is bounded by the second fastening portion and the rack when the slide assembly is installed to the rack. A hook portion of the chassis can be inserted into the engaging space to contact against the second fastening portion so that the chassis is not allowed to be pulled out from the rack when the chassis is installed to the rack.

8 Claims, 11 Drawing Sheets

(56) References Cited

U.S. PATENT DOCUMENTS

| | | | | |
|---|---|---|---|---|
| 7,762,411 B2* | 7/2010 | Hilburn | A47B 88/044 | 211/192 |
| 8,028,965 B2* | 10/2011 | Chen | A47B 88/044 | 248/298.1 |
| 8,371,454 B2 | 2/2013 | Chen et al. | | |
| 8,770,528 B2* | 7/2014 | Chen | A47B 88/044 | 211/26 |
| 2001/0040142 A1* | 11/2001 | Haney | A47B 88/044 | 211/183 |
| 2005/0156493 A1* | 7/2005 | Yang | H05K 7/1489 | 312/334.5 |
| 2008/0122333 A1* | 5/2008 | Tseng | A47B 88/10 | 312/333 |
| 2009/0101603 A1* | 4/2009 | Hilburn | A47B 88/044 | 211/26 |
| 2009/0283652 A1* | 11/2009 | Chen | A47B 88/044 | 248/298.1 |
| 2009/0294393 A1* | 12/2009 | Chen | H05K 7/1489 | 211/175 |
| 2010/0072153 A1* | 3/2010 | Chen | A47B 88/044 | 211/183 |
| 2010/0251534 A1* | 10/2010 | Hilburn | A47B 88/044 | 29/525.01 |
| 2011/0233355 A1* | 9/2011 | Peng | H05K 7/1489 | 248/218.4 |
| 2011/0290746 A1* | 12/2011 | Lu | H05K 7/1489 | 211/26 |
| 2012/0076446 A1* | 3/2012 | Chen | A47B 88/044 | 384/21 |
| 2013/0075350 A1* | 3/2013 | Raney | A47B 88/044 | 211/13.1 |
| 2014/0217049 A1* | 8/2014 | Chen | H05K 7/1489 | 211/195 |
| 2014/0363108 A1* | 12/2014 | Chen | A47B 88/044 | 384/22 |
| 2014/0363109 A1* | 12/2014 | Chen | A47B 88/044 | 384/22 |
| 2015/0069196 A1* | 3/2015 | Chen | A47B 88/044 | 248/218.4 |

* cited by examiner

SLIDE ASSEMBLY

FIELD OF THE INVENTION

The present invention relates to a slide assembly, and more particularly, to a slide assembly for installing a chassis to a rack.

BACKGROUND OF THE INVENTION

U.S. Pat. No. 8,371,454 has disclosed a conventional rack system, which comprises a bracket assembly for installing a chassis to a rack, and is incorporated herein by reference.

The rack of the conventional rack system has a plurality of holes, and the bracket assembly of the conventional rack system has a bracket, a base and a fastening member, wherein the bracket has a plurality of bracket holes. The base is securely connected to the bracket and has multiple connection members located corresponding to the bracket holes. The fastening member is pivotally connected to the bracket and includes a resilient leg and a fastening arm which has at least one fastening portion. One of the connection members of the base is inserted into one of the holes of the rack, and the fastening portion of the fastening arm is hooked to the rack. However, the conventional rack system lacks of a mechanism for installing the chassis to the rack, such that the chassis may slip off from the rack easily to damage the equipment or cause injury.

The present invention intends to provide a slide assembly which is able to secure the chassis in the rack.

SUMMARY OF THE INVENTION

The present invention relates to a slide assembly for installing a chassis to a rack, wherein the rack has a first post and a second post, and the first and second posts each have a plurality of holes. The chassis has a hook portion. The slide assembly of the present invention comprises a first rail having a first end and a second end which is located corresponding to the first end. The first rail defines a first slide path longitudinally therein. A second rail is slidable relative to the first slide path of the first rail. A first bracket has a first end connected adjacent to the first end of the first rail and a second end connected to the first post of the rack. A second bracket has a first end connected adjacent to the second end of the first rail and a second end connected to the second post of the rack. The first bracket has a bracket board which has a first portion and a second portion. The second portion bends and extends from an end of the first portion. An engaging member is pivotally connected to the bracket board and has a body portion, a first fastening portion and a second fastening portion. The first and second fastening portions are substantially and perpendicularly connected to an end of the body portion. The second fastening portion bends and extends from an end of the first fastening portion. An engaging space is bounded by the first post and the second fastening portion when the second end of the first bracket is connected to the first post of the rack. A resilient member provides a force to the engaging member to maintain the first fastening portion to be connected to the first post of the rack, wherein the hook portion of the chassis is inserted into the engaging space bounded between the first post and the second fastening portion, and contacts the second fastening portion, such that when the chassis is located in the rack, the chassis is not pulled out from the rack.

Preferably, a third rail is slidably connected between the first and second rails to form a three-stage slide assembly.

Preferably, a back board is fixed adjacent to the first end of the first rail. The back board defines a second slide path longitudinally therein. The bracket board of the first bracket is movably received by the second slide path of the back board such that the first bracket is longitudinally movable along the back board.

Preferably, the first bracket has at least one projecting member which is connected to the second portion of the bracket board. The at least one projecting member is inserted into one of the holes of the first post.

Preferably, the engaging member comprises an operation portion which is connected to the body portion. The bracket board has a slot which is located between the first and second portions thereof. When the operation portion of the engaging member is operated, the slot accommodates the operation portion.

The present invention also provides a slide assembly which comprises a first rail, a second rail and a third rail. The first rail has a first end and a second end which is located corresponding to the first end. The third rail is slidably connected between the first and second rails. A first bracket is connected adjacent to the first end of the first rail. A second bracket is connected adjacent to the second end of the first rail. The first bracket has a bracket board which has a first portion and a second portion. The second portion bends and extends from an end of the first portion. At least one projecting member is connected to the second portion of the bracket board. An engaging member is pivotally connected to the bracket board and has a body portion, a first fastening portion and a second fastening portion. The first and second fastening portions are substantially and perpendicularly connected to an end of the body portion. The second fastening portion bends and extends from an end of the first fastening portion. A resilient member provides a force to the engaging member to maintain the first fastening portion to be positioned close to the at least one projecting member.

Preferably, a back board is fixed to the first rail. The bracket board is movably connected to the back board so that the first bracket is longitudinally movable along the back board.

Preferably, the engaging member comprises an operation portion which is connected to the body portion. The bracket board has a slot which is bounded by the first and second portions of the bracket board. When the operation portion of the engaging member is operated, the slot accommodates the operation portion.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
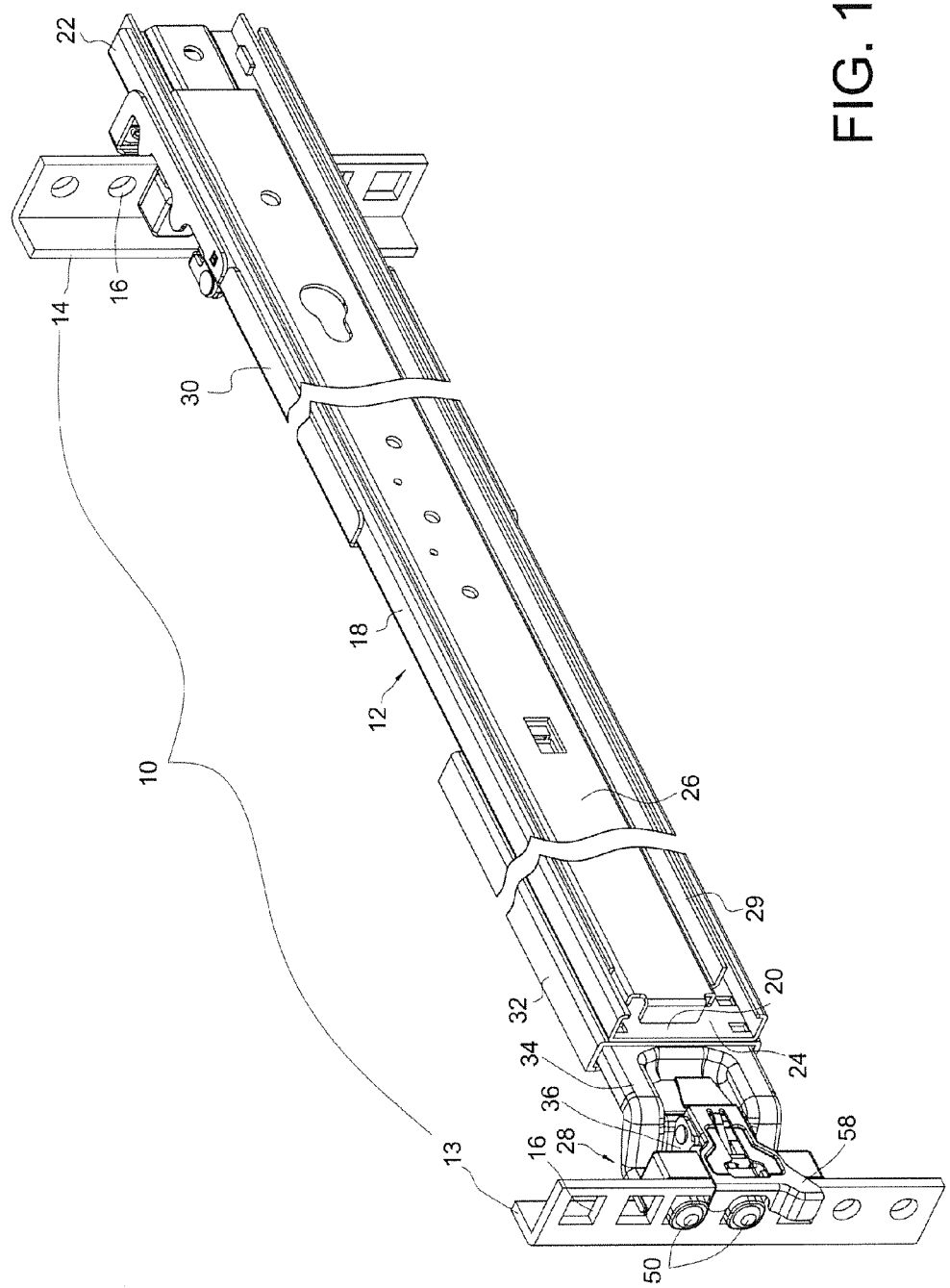
FIG. 1 is a perspective view of a slide assembly in accordance with a preferred embodiment of the present invention, wherein the slide assembly is installed to a rack.
Figure 2:
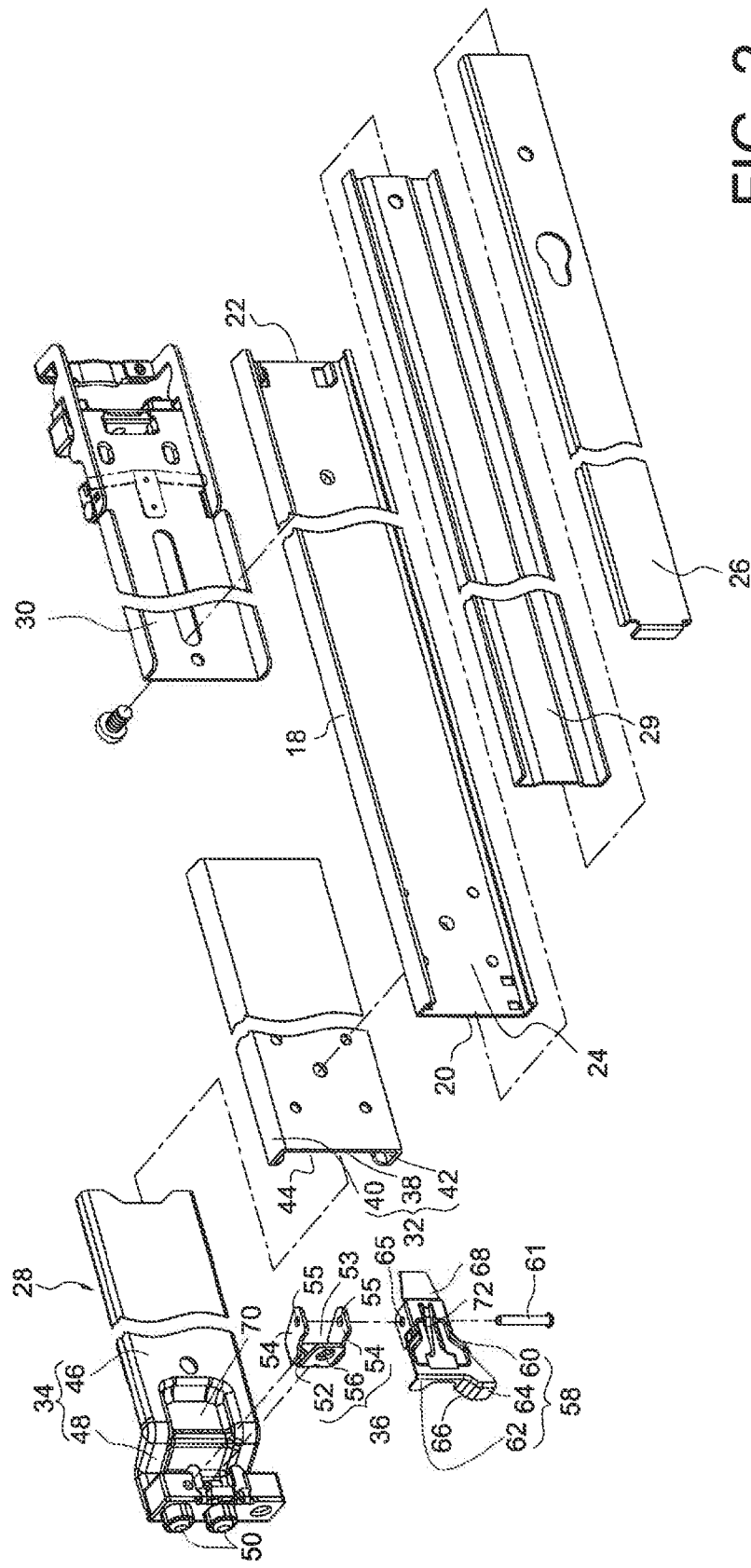
FIG. 2 is an exploded view of the slide assembly in accordance with the preferred embodiment of the present invention.

Referring to FIGS. 1 and 2, a preferred embodiment of the present invention comprises a rack 10 and a slide assembly 12. The slide assembly 12 is used to install a chassis to the rack 10. The rack 10 at least comprises a first post 13 and a second post 14, wherein the first and second posts 13, 14 each have a plurality of holes 16. The slide assembly 12 is connected between the first and second posts 13, 14. The slide assembly 12 comprises a first rail 18, a second rail 26, a first bracket 28 and a second bracket 30.

The first rail 18 has a first end 20 and a second end 22 which is located corresponding to the first end 20. The first rail 18 defines a first slide path 24 longitudinally therein. The second rail 26 is slidable relative to the first slide path 24 of the first rail 18. Preferably, a third rail 29 is slidably connected between the first and second rails 18, 26 to form a three-stage slide assembly to extend the length of the slide assembly 12.

One end of the first bracket 28 is connected adjacent to the first end 20 of the first rail 18, and the other end of the first bracket 28 is adapted to be connected to the first post 13 of the rack 10. One end of the second bracket 30 is connected adjacent to the second end 22 of the first rail 18, and the other end of the second bracket 30 is adapted to be connected to the second post 14 of the rack 10.

The first bracket 28 comprises a bracket board 34, a connecting member 36, at least one projecting member 50 and an engaging member 58. Preferably, the slide assembly 12 further has a back board 32. The back board 32 is connected to the first rail 18 such that the first bracket 28 can be connected to the first rail 18 by the back board 32. In one embodiment, the back board 32 is fixedly connected adjacent to the first end 20 of the first rail 18 and has a top wall 40, a bottom wall 42 and a side wall 38. The side wall 38 extends between the top and bottom walls 40, 42 such that a second slide path 44 is bounded by the top wall 40, the bottom wall 42 and the side wall 38, and the bracket board 34 of the first bracket 28 is movably connected to the back board 32 so that the first bracket 28 can move longitudinally along the back board 32.

In more detail, the bracket board 34 has a first portion 46 and a second portion 48, wherein the second portion 48 bends and extends from one end of the first portion 46. In this embodiment, the first portion 46 of the bracket board 34 is received by the second slide path 44 of the back board 32 such that the first bracket 28 is longitudinally movable along the back board 32. The connecting member 36 has a base portion 52, a pair of parallel ears 54 extending from opposing sides of the base portion 52 having holes 55 formed therein and a tab 53 extending from a front side of the base portion 52 and having an aperture 56 formed therein, wherein the connecting member 36 is fixedly connected to the second portion 48 of the bracket board 34 by riveting the base portion 52 to the second portion 48.

Figure 3:
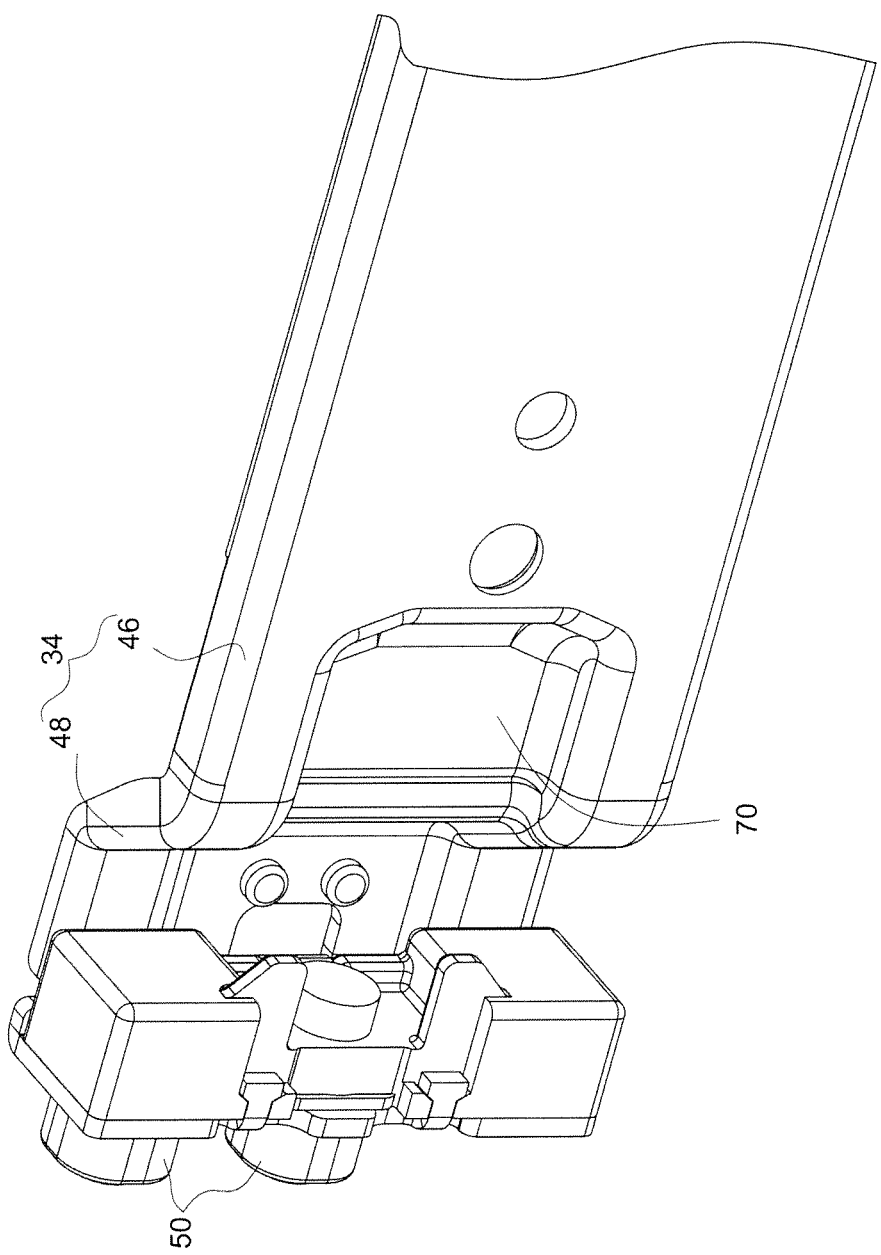
FIG. 3 is an enlarged view to show a portion of the bracket board of the slide assembly in accordance with the preferred embodiment of the present invention.

Referring to FIG. 3, the at least one projecting member 50 of the firs bracket 28 is longitudinally connected to the second portion 48 of the bracket board 34, such that the bracket board 34 is able to connect one end of the slide assembly 12 to the first post 13 by insertion of the at least one projecting member 50 into one of the holes 16 of the first post 13. Preferably, the second bracket 30 also has at least one projecting member 50 which is adapted to be inserted into one of the holes 16 of the second post 14 to connect the other end of the slide assembly 12 to the second post 14.

Figure 4A:
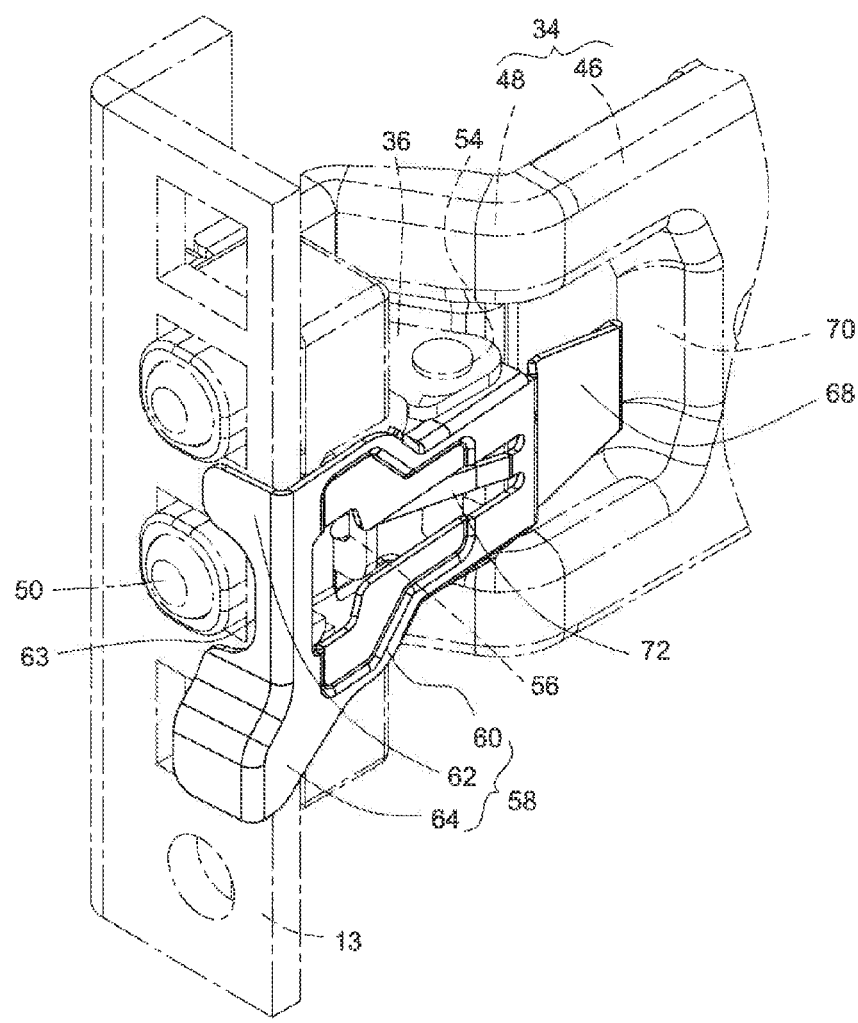
FIG. 4A is an enlarged view to show a portion of the slide assembly in FIG. 1.
Figure 4B:
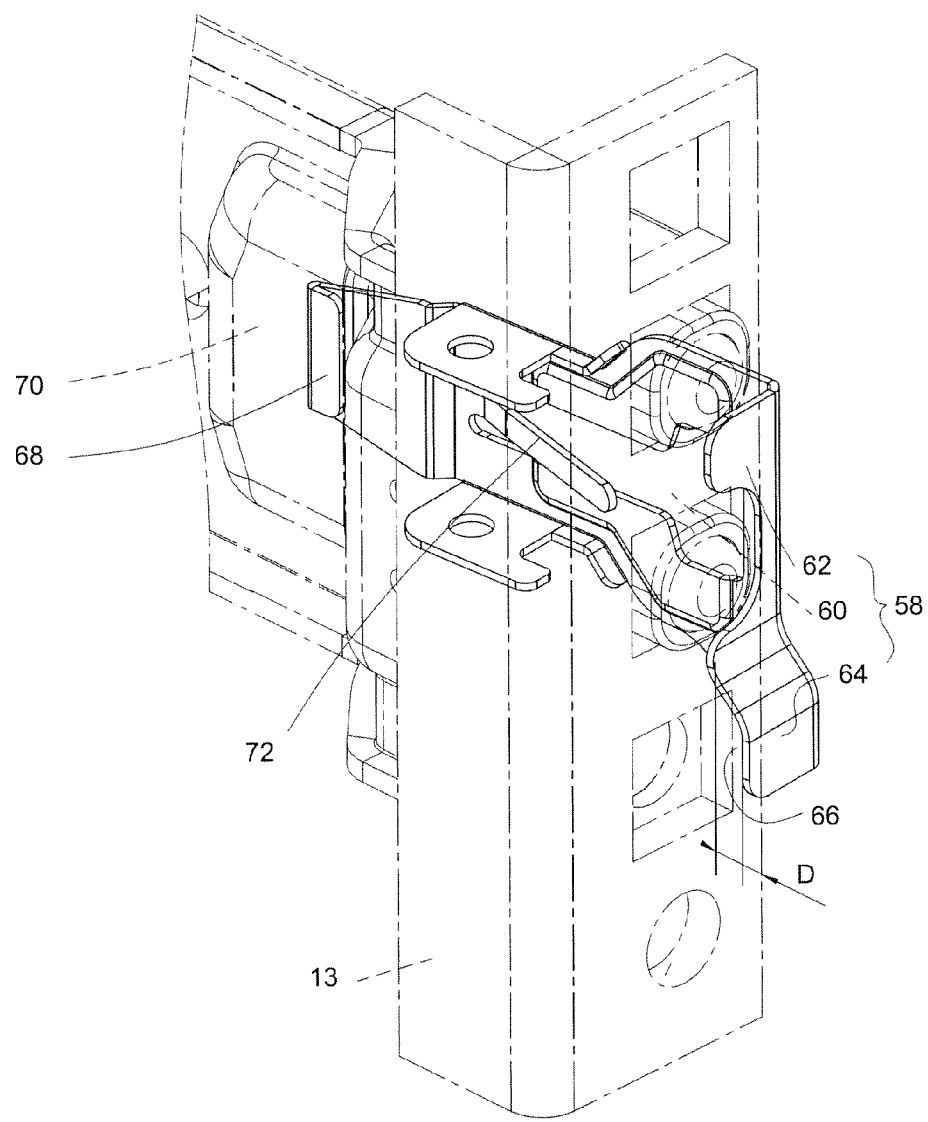
FIG. 4B is another enlarged view to show a portion of the slide assembly in FIG. 1.

Referring to FIGS. 2, 4A and 4B, the engaging member 58 comprises a body portion 60 having a pair of opposed holes 65 (only one of which is shown in FIG. 2) and can be pivotally connected to a position close to the second portion 48 of the bracket board 34, such as, be pivotally connected to the pair of ears 54 of the connecting member 36 by the pin 61 passed through the holes 55 and 65 of the ears 54 and body portion 60, respectively. The engaging member 58 further comprises a first fastening portion 62 and a second fastening portion 64, wherein the first and second fastening portions 62, 64 are substantially and perpendicularly connected to one end of the body portion 60, and the second fastening portion 64 bends and extends from one end of the first fastening portion 62, whereby when the first bracket 28 is connected to the first post 13, the first fastening portion 62 contacts the first post 13, and an engaging space 66 is bounded by the first post 13 and the second fastening portion 64. The engaging space 66 has a width "D". A recess 63 is formed between the first and second fastening portions and into which the at least one projecting member 50 is received.

The engaging member 58 further comprises an operation portion 68 which is connected to the body portion 60, and the bracket board 34 has a slot 70 which is bounded by the first and second portions 46, 48 of the bracket board 34. When the operation portion 68 of the engaging member 58 is operated, such as being pressed, the slot 70 can accommodate the operation portion 68.

Preferably, the first bracket 28 further comprises a resilient member 72, wherein one end of the resilient member 72 is connected to the engaging member 58, and the other end of the resilient member 72 contacts against the contact portion 56 of the connecting member 36. The resilient member 72 provides a force to the engaging member 58 to maintain the first fastening portion 62 to be positioned close to the at least one projecting member 50 and to be securely connected to the first post 13.

Figure 5A:
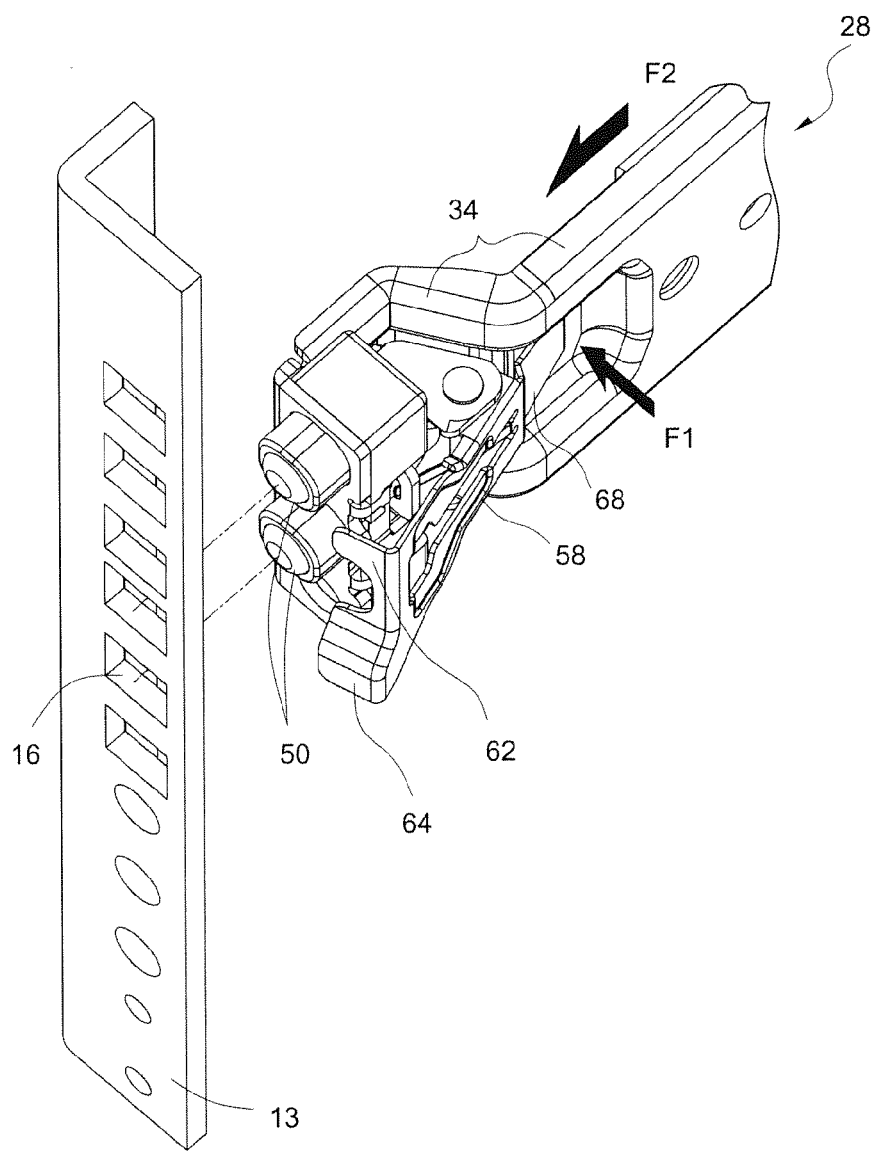
FIG. 5A shows the operation step for installing a first bracket of the slide assembly to a first post of the rack.
Figure 5B:
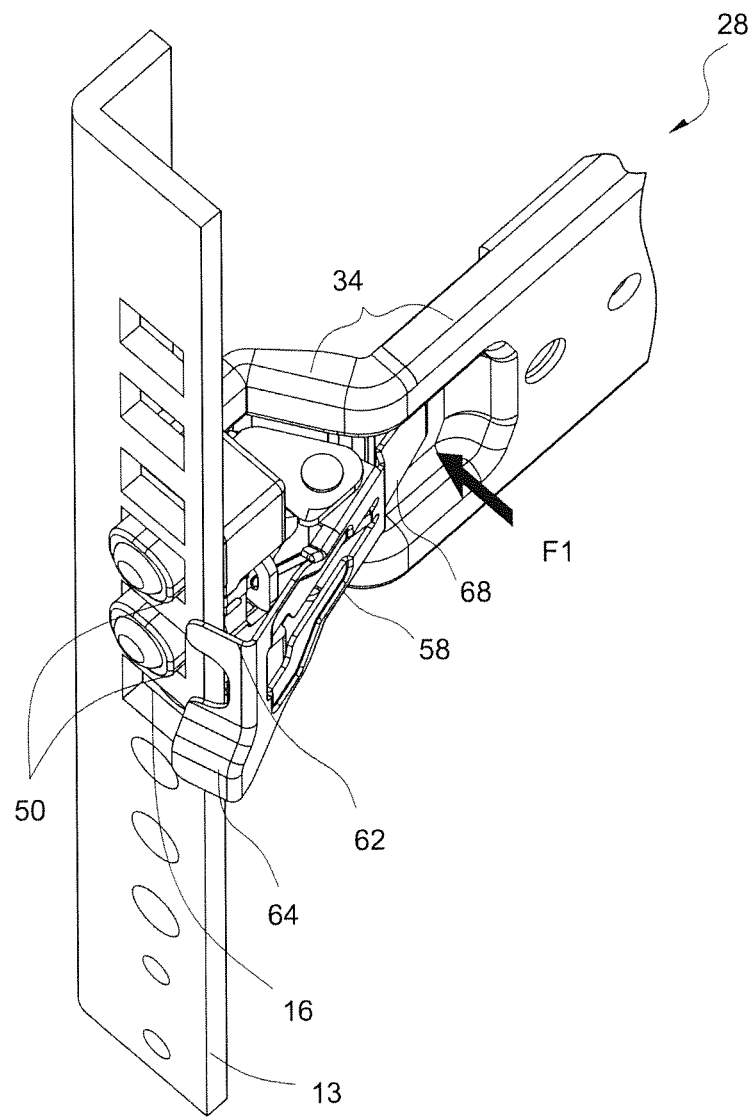
FIG. 5B shows another operation step for installing the first bracket of the slide assembly to the first post of the rack.
Figure 5C:
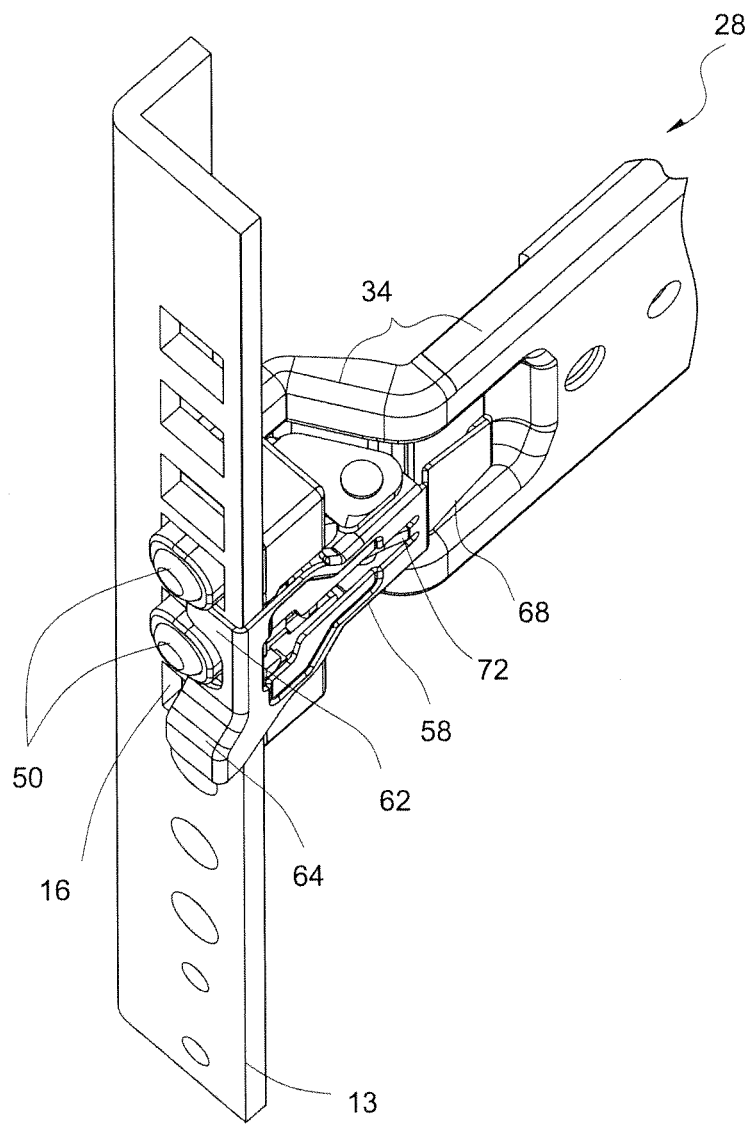
FIG. 5C shows yet another operation step for installing the first bracket of the slide assembly to the first post of the rack.

FIGS. 5A, 5B and 5C show the installation of the first bracket 28 to the first post 13 of the rack 10. A force F1 is applied to the operation portion 68 of the engaging member 58 to let the first and second fastening portions 62, 64 of the engaging member 58 be away from the at least one projecting member 50 for a distance, and a force F2 is applied to the bracket board 34 to insert the at least one projecting member 50 into one of the holes 16 of the first post 13 (as shown in FIG. 5B), and then the forces F1 and F2 are released at the same time (as shown in FIG. 5C) such that a force stored in the resilient member 72 is released to recover the first and second fastening portions 62, 64 of the engaging member 58 to a position which is close to the at least one projecting member 50. Therefore, the first fastening portion 62 is securely connected to the first post 13, and thus the first bracket 28 is positioned and installed to the first post 13.

Figure 6:
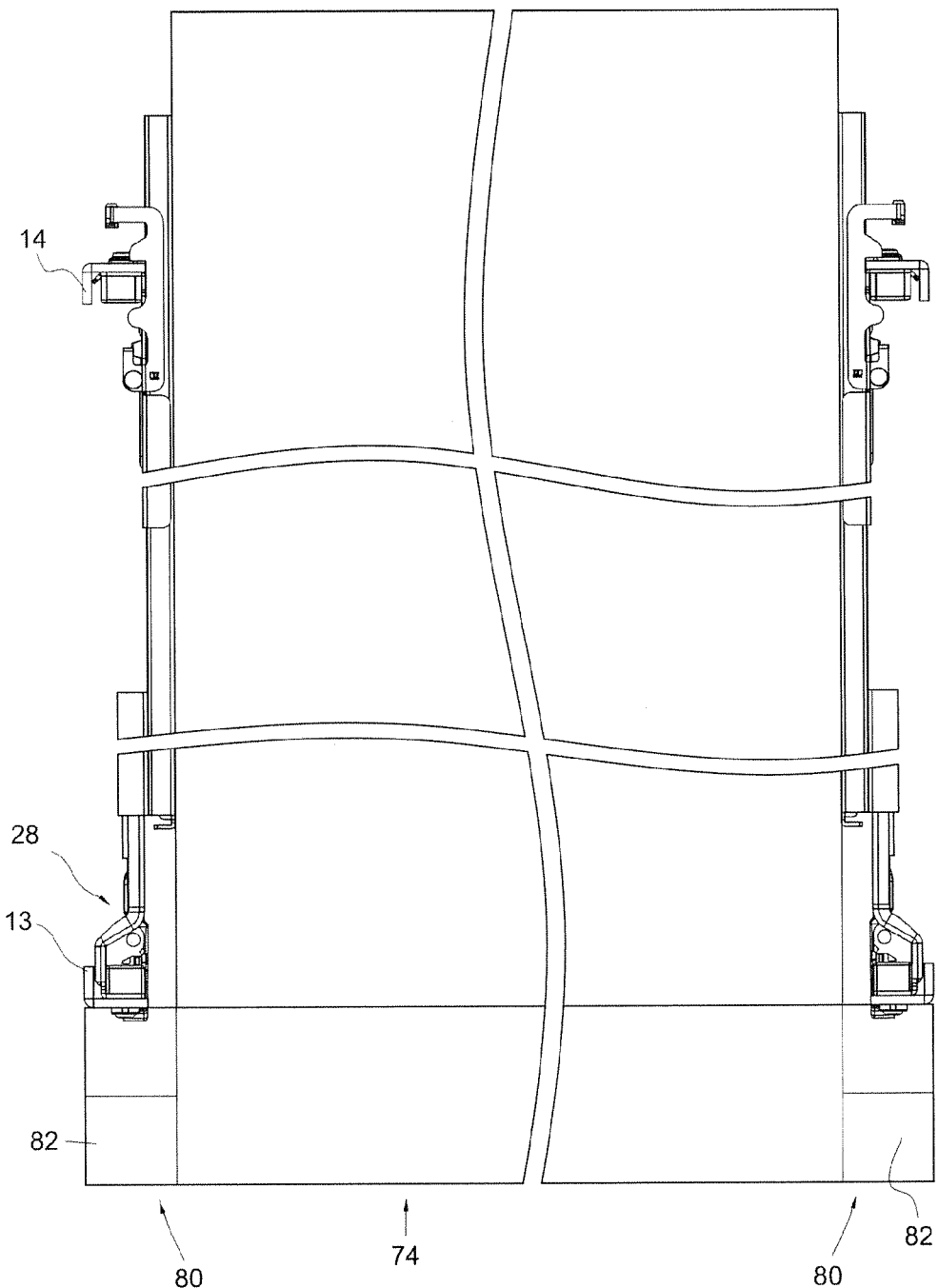
FIG. 6 is a top view of the slide assembly in accordance with the preferred embodiment of the present invention, wherein the slide assembly is installed to the rack and a chassis is received by the rack.
Figure 7:
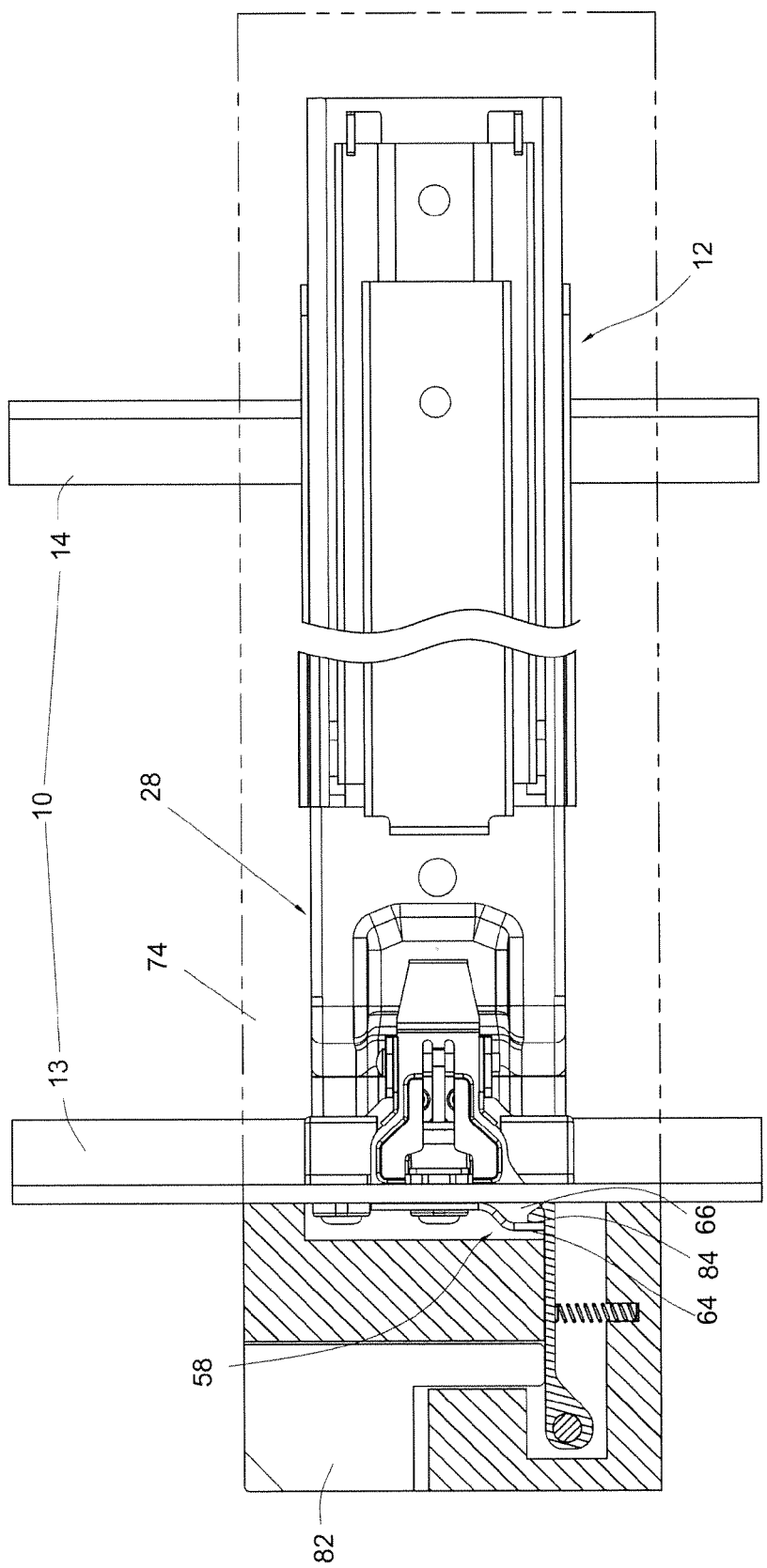
FIG. 7 is a side view of the slide assembly in FIG. 6.

Referring to FIGS. 6 and 7, a chassis 74 has one side thereof connected to the slide assembly 12. Preferably, the chassis 74 has an engaging mechanism 80 which is located corresponding to the second fastening portion 64 of the engaging member 58 of the first bracket 28. The engaging mechanism 80 comprises a control portion 82 and a hook portion 84. When the chassis 74 together with the slide assembly 12 are received by the rack 10, the hook portion 84 is inserted into the engaging space 66 bounded by the first post 13 of the rack 10 and the second fastening portion 64 of the engaging member 58 to contact the second fastening portion 64 of the engaging member 58, such that the hook portion 84 is retained in the engaging space 66. Therefore, the chassis 74 is positioned and prevented from being pulled out from the rack 10 easily.

Figure 8:
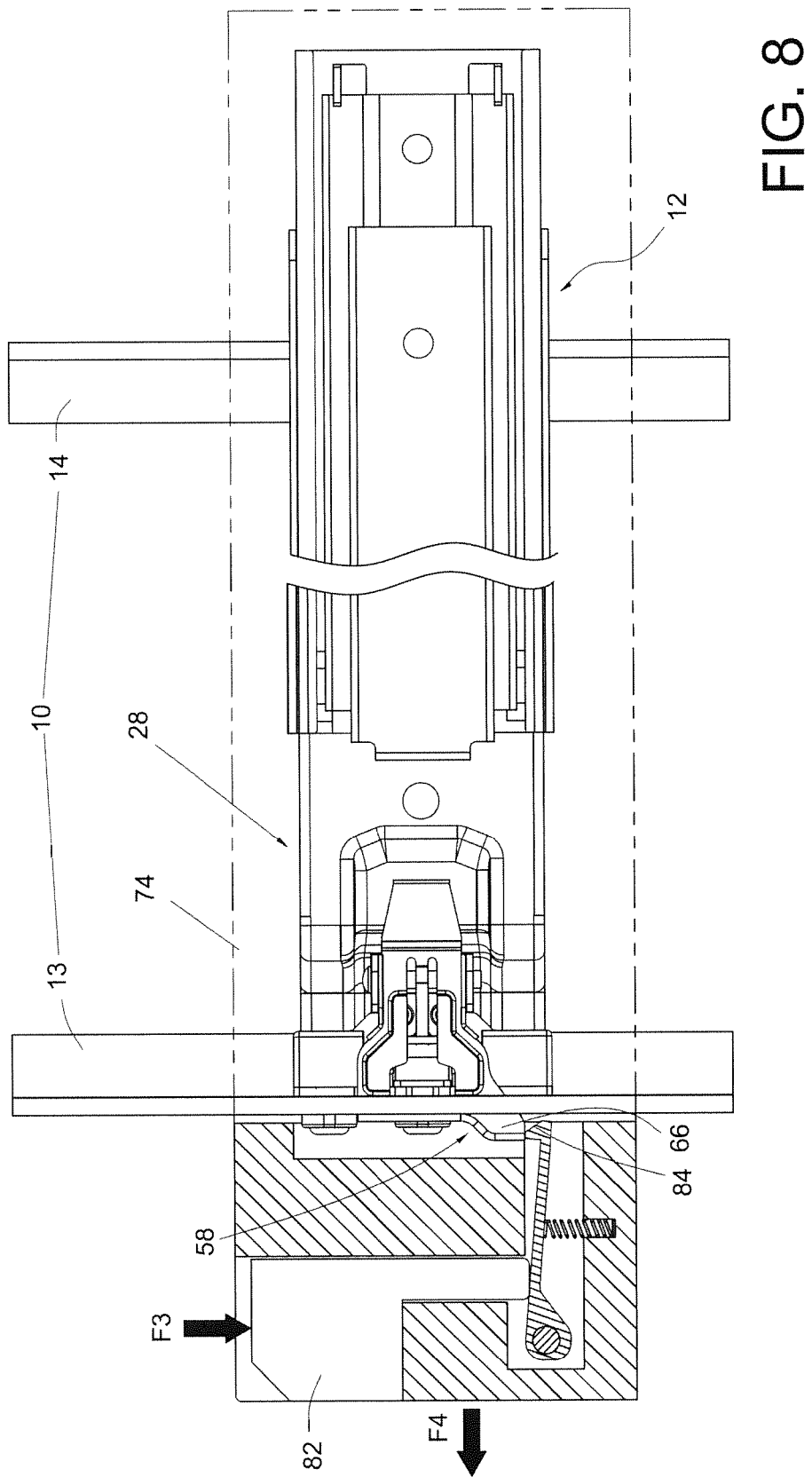
FIG. 8 is a side view to show the operation step for removing the chassis from the rack.

Referring to FIG. 8, when a force F3 is applied to the control portion 82 to press the hook portion 84 out of the engaging space 66, the chassis 74 can be pulled out from the rack 10 as a force F4 is further applied to the chassis 74.

While we have shown and described the embodiment in accordance with the present invention, it should be clear to those skilled in the art that further embodiments may be made without departing from the scope of the present invention.

What is claimed is:

1. A slide assembly for installing a chassis to a rack, the rack having a first post and a second post, the first and second posts each having a plurality of holes, the chassis having a hook portion, characterized in that the slide assembly comprises:
   a first rail having opposing first and second ends, the first rail defining a first slide path longitudinally therein;
   a second rail being slidable relative to the first slide path of the first rail;
   a third rail slidably connected between the first and second rails;
   a first bracket, a first end of the first bracket being connected adjacent to the first end of the first rail, a second end of the first bracket being adapted to be connected to the first post of the rack;
   a second bracket, a first end of the second bracket being connected adjacent to the second end of the first rail, a second end of the second bracket being adapted to be connected to the second post of the rack;
   wherein the first bracket includes:
      a bracket board having a first portion and a second portion, the second portion is bent and extends from an end of the first portion;
      at least one projecting member connected to the second portion of the bracket board;
      an engaging member pivotally connected to the bracket board and having a body portion, a first fastening portion and a second fastening portion, the first and second fastening portions substantially and perpendicularly connected to an end of the body portion, the second fastening portion is bent and extends from an end of the first fastening portion so that an engaging space is bounded by the first post and the second fastening portion when the second end of the first bracket is connected to the first post of the rack;
      a connecting member having a base portion fastened to the bracket board, the base portion having opposing first and second sides and a front and rear side, the base portion further having a pair of parallel spaced ears extending perpendicularly from the first and second sides and a tab extending from the front side, the tab having an aperture formed therein, said engaging member being pivotally connected to said pair of ears, and said connecting member being sandwiched between said bracket board and said engaging member; and
      a resilient member extending from the body portion of the engaging member for providing a force to the engaging member, the resilient member being removably inserted within the aperture of the tab of the connecting member to maintain the first fastening portion of the engaging member close to the at least one projecting member such that the at least one projecting member is located in a recess formed between the first fastening portion and the second fastening portion and thereby connected to the first post of the rack,
   wherein the hook portion of the chassis is adapted to be inserted into the engaging space bounded by the first post of the rack and the second fastening portion of the engaging member to contact against the second fastening portion, whereby the chassis is prevented from being pulled out from the rack when being installed to the rack.

2. The slide assembly as claimed in claim 1, further comprising a third rail slidably connected between the first and second rails to form a three-stage slide assembly.

3. The slide assembly as claimed in claim 1, further comprising a back board fixed adjacent to the first end of the first rail, wherein the back board defines a second slide path longitudinally therein, and the bracket board of the first bracket is movably received by the second slide path of the back board such that the first bracket is longitudinally movable along the back board.

4. The slide assembly as claimed in claim 1, wherein the first bracket has at least one projecting member connected to the second portion of the bracket board, and the at least one projecting member is adapted to be inserted into one of the holes of the first post.

5. The slide assembly as claimed in claim 1, wherein the engaging member comprises an operation portion connected to the body portion, and the bracket board has a slot bounded by the first and second portions thereof so as to accommodate the operation portion of the engaging member by the slot when the operation portion is operated.

6. A slide assembly comprising:
   a first rail having opposing first and second ends;
   a second rail;
   a third rail slidably connected between the first and second rails;
   a first bracket connected adjacent to the first end of the first rail;
   a second bracket connected adjacent to the second end of the first rail;
   wherein the first bracket includes:
      a bracket board having a first portion and a second portion, the second portion is bent and extends from an end of the first portion;
      at least one projecting member connected to the second portion of the bracket board;
      an engaging member pivotally connected to the bracket board and having a body portion, a first fastening portion and a second fastening portion, the first and second fastening portions substantially and perpendicularly connected to an end of the body portion, the second fastening portion is bent and extends from an end of the first fastening portion;
      a connecting member having a base portion fastened to the bracket board, the base portion having opposing first and second sides and a front and rear side, the base portion further having a pair of parallel spaced ears extending perpendicularly from the first and second sides and a tab extending from the front side, the tab having an aperture formed therein, said engaging member being pivotally connected to said pair of ears, and said connecting member being sandwiched between said bracket board and said engaging member; and a resilient member extending from the body portion of the engaging member for providing a force to the engaging member, the resilient member being removably inserted within the aperture of the tab of said connecting member to maintain the first fastening portion close to the at least one projecting member such that the at least one projecting member is located in a recess formed between the first fastening portion and the second fastening portion.

7. The slide assembly as claimed in claim 6, further comprising a back board fixed to the first rail, wherein the bracket board is movably connected to the back board so that the first bracket is longitudinally movable along the back board.

8. The slide assembly as claimed in claim 6, wherein the engaging member comprises an operation portion connected to the body portion, and the bracket board has a slot, and wherein the slot is bounded by the first and second portions of the bracket board so as to accommodate the operation portion of the engaging member when the operation portion of the engaging member is operated.

\* \* \* \* \*